(12) United States Patent
Doerr et al.

(10) Patent No.: US 11,855,412 B1
(45) Date of Patent: Dec. 26, 2023

(54) TUNABLE LASER

(71) Applicant: Acacia Communications, Inc., Maynard, MA (US)

(72) Inventors: Christopher Doerr, Middletown, NJ (US); Xue Huang, Holmdel, NJ (US)

(73) Assignee: Acacia Communications, Inc., Maynard, MA (US)

( * ) Notice: Subject to any disclaimer, the term of this patent is extended or adjusted under 35 U.S.C. 154(b) by 0 days.

(21) Appl. No.: 16/836,274

(22) Filed: Mar. 31, 2020

(51) Int. Cl.
| | |
|---|---|
| *H01S 5/14* | (2006.01) |
| *H01S 3/10* | (2006.01) |
| *H01S 5/10* | (2021.01) |
| *H01S 3/106* | (2006.01) |
| *H01S 3/105* | (2006.01) |
| *H01S 5/0687* | (2006.01) |
| *H01S 3/137* | (2006.01) |
| *H01S 3/13* | (2006.01) |
| *H01S 5/068* | (2006.01) |

(52) U.S. Cl.
CPC .............. *H01S 5/142* (2013.01); *H01S 3/105* (2013.01); *H01S 3/10053* (2013.01); *H01S 3/1062* (2013.01); *H01S 3/137* (2013.01); *H01S 3/1307* (2013.01); *H01S 5/0687* (2013.01); *H01S 5/06821* (2013.01); *H01S 5/1071* (2013.01); *H01S 5/141* (2013.01)

(58) Field of Classification Search
None
See application file for complete search history.

(56) References Cited

U.S. PATENT DOCUMENTS

| | | | | |
|---|---|---|---|---|
| 4,291,281 | A * | 9/1981 | Pinard ................... | H01S 3/0826 372/97 |
| 5,040,182 | A * | 8/1991 | Spinelli ................. | H01S 3/1109 372/18 |
| 5,444,724 | A * | 8/1995 | Goto ...................... | H01S 3/1062 372/20 |
| 6,697,394 | B2 * | 2/2004 | Tuennermann ......... | H01S 3/105 372/12 |
| 9,958,252 | B1 * | 5/2018 | Diels ...................... | H01S 3/1083 |
| 11,201,453 | B2 * | 12/2021 | Vizbaras ................. | H01S 5/142 |
| 2003/0035446 | A1 * | 2/2003 | Griffel .................... | H01S 5/141 372/20 |
| 2008/0232409 | A1 * | 9/2008 | Yamazaki .......... | G02B 6/12007 372/20 |
| 2012/0051375 | A1 * | 3/2012 | Karpushko ............. | H01S 3/109 372/22 |
| 2016/0334648 | A1 * | 11/2016 | Lu .......................... | G02F 1/2257 |
| 2017/0184787 | A1 * | 6/2017 | D'Agostino ......... | G02B 6/2813 |
| 2019/0052044 | A1 * | 2/2019 | Dong .................... | H04B 10/504 |
| 2019/0056213 | A1 * | 2/2019 | Habrich ................. | G01N 21/45 |

FOREIGN PATENT DOCUMENTS

CN 111342342 A * 6/2020 ............. H01S 5/141

* cited by examiner

*Primary Examiner* — Tod T Van Roy
(74) *Attorney, Agent, or Firm* — K&L Gates LLP

(57) ABSTRACT

A method, apparatus, and system for an external cavity laser with a Michelson Interferometer.

19 Claims, 4 Drawing Sheets

Free spectrum range: $FSR = c_0/(2*n_g*\Delta L)$
$c_0$ is the speed of light in vacuum
$n_g$ is the group refractive index
$\Delta L$ is the length difference of the two MI arms

TUNABLE LASER

BACKGROUND

Optical transmission of information over a fiber optic cable often encodes the information on a light wave from a laser.

BRIEF DESCRIPTION OF THE FIGURES

Various aspects and embodiments of the application will be described with reference to the following example embodiments. It should be appreciated that the figures are not necessarily drawn to scale.

SUMMARY

Figure 1B:
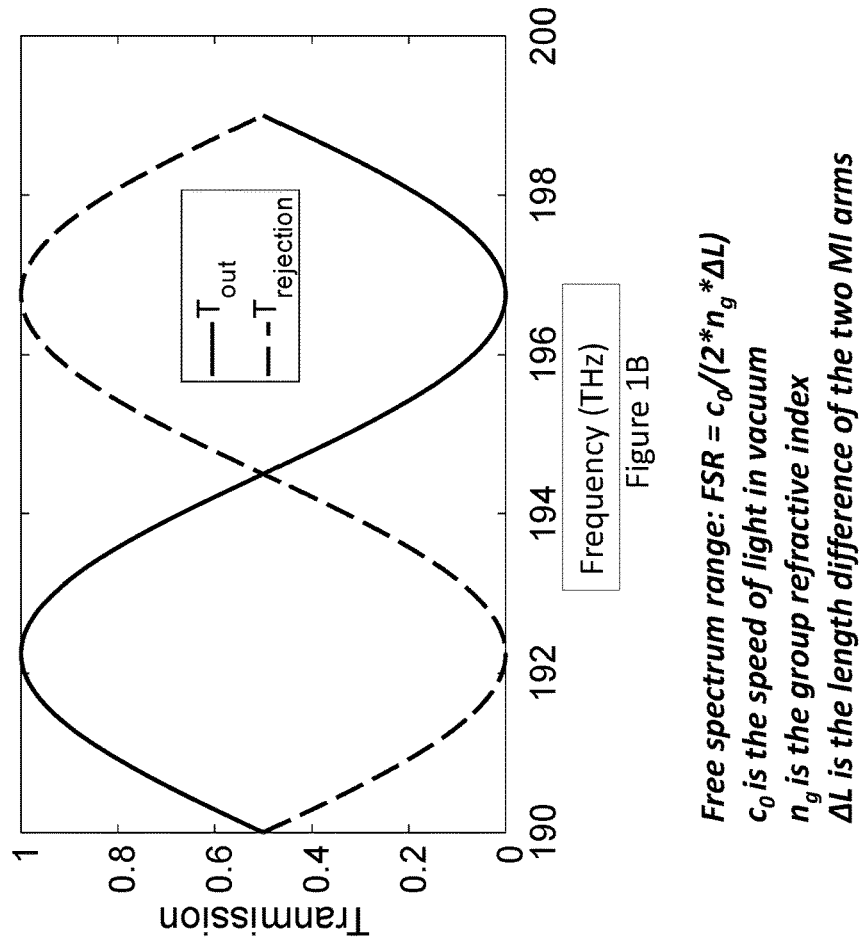
FIG. 1B is a simplified illustration graph of the transmission spectrum of the Michelson Interferometer, in accordance with an embodiment of the present disclosure.

A method, apparatus, and system for a laser with an external cavity.

DETAILED DESCRIPTION

In many embodiments, an optical communication or transmission system may include a transmitter and a receiver. In most embodiments, a transmission, such as a set of digital bits, may be encoded in a signal at a transmitter. In certain embodiments, bits may be encoded in a wavelength of light.

In most embodiments, in a coherent optical communication system, a carrier may be an optical output (light) from a laser at the transmitter. In different embodiments, different lasers may be at different wavelengths of light. In almost all embodiments, a transmitter may have a laser producing a wavelength of light onto which data is encoded.

Typically, a "laser" stands for Light Amplification by Stimulated Emission of Radiation. Conventionally, a laser created light of a single color or wavelength that is directed in a single direction. Usually, a laser has a gain medium that amplifies light. Often, the gain medium functions by amplifying light through stimulating emission using a resonant cavity. Generally, a cavity of a laser may be reflective to cause light to reflect within the cavity to amplify the light to a particular level of power. Conventionally, an external cavity laser may be a laser that has a cavity outside of a gain chip. Often, an external cavity may enable the cavity to have different properties than if it was in the gain chip, such as having a larger cavity. In many embodiments, an external cavity laser may have rings or ring resonators inside a cavity of the external cavity of the laser.

In many embodiments, a gain medium may be required to generate laser light. In most embodiments, optical communication applications usually may require laser light to be wavelength tunable, by employing wavelength-selective filters. In some embodiments, wavelength-selective filters may be made on the laser gain medium, or applied in an external cavity that couples light from and back to the gain medium.

In many embodiments, it may be necessary to tune a tunable laser to a specific wavelength. In most embodiments, a laser may be able to output different wavelengths of light, and the wavelength of any outputted light may be influenced by temperature and distortion from different components of the laser and/or environment. Conventionally, lasers are mounted on thermoelectric heaters/coolers and control electronics temperature tune the laser by changing electrical and environmental properties of components of the laser. Generally, some laser systems may use a thermo-optic phase shifter (TOPS) to help tune the laser. Usually, changing the temperature of a laser and/or components of the laser via change in the applied electrical power may change the optical properties of the laser or components of the laser.

In some embodiments of the current disclosure, there may be one or more ring resonators inside a laser cavity for wavelength selection. In many embodiments, tuning a laser may be accomplished by changing a resonant wavelength of the rings. In some embodiments, target electrical power applied to a TOPS may be calculated from formulas with parameters calibrated for resonant wavelength versus TOPS power.

Conventionally, laser tuning may be performed using wavelength-selective filters. Generally, wavelength-selective filters may be tuned using calibrated values. Conventionally, a cavity laser may function by lasing at a transmission peak wavelength of the filters, to minimize the cavity loss.

In many embodiments, Applicants have realized that for a tunable laser which consists of a gain chip and an external cavity for wavelength tuning, high-finesse filter(s) may be used in an external cavity to achieve single mode operation. In certain embodiments, tunable lasers may use two rings with different radii R1 and R2, respectively. In most embodiments, wavelength tuning of these lasers may be achieved by aligning the resonant wavelengths of two rings to use Vernier effects. In almost all embodiments, Applicants have realized that a tuning range of lasers using two rings may be limited by a least common multiple of each respective ring's free spectrum range (FSR).

In a particular embodiment, a least common multiple of FSR may be shown by the following equation:

$$FSR12 = m*FSR1 = (m+1)*FSR2, \quad (1)$$

where FSR12 is the common FSR of two rings, m is an integer, and FSR1 and FSR2 are the FSRs of two rings (FSR1>FSR2), respectively. In this particular embodiment, the achieved tuning range may be about 40-50 nm.

In certain embodiments, Applicants have realized that it may be possible to improve a tuning range by adding a Mach-Zehnder Interferometer (MZI) into a laser cavity. In some embodiments, a single ring plus an MZI may be used as wavelength filters for tuning a lasing wavelength. In many embodiments, Applicants have realized that an MZI may cover a 95 nm tuning range, the side mode suppression ratio (SMSR) may be 35 dB since one narrow filter alone may not provide sufficient side mode suppression and may not provide sufficient tuning for certain purposes. In certain embodiments with an MZI, a laser may experience cavity mode hop and discontinuities in the tuning spectrum. In a particular embodiment, an MZI may be used with two Vernier rings, to provide improved side mode suppression and the SMSR is 50 dB; where a tuning range is only 55 nm, without large improvement compared with two ring only embodiments.

In most embodiments, use of a Michelson Interferometer (MI) may enable coarse filter tuning and phase tuning in a small footprint. In certain embodiments, an MI may be used as a coarse filter with two Vernier rings as fine filters. In many embodiments, an MI may provide highly compact, small footprint integration. In almost all embodiments, an MI may provide both coarse filter tuning and cavity phase tuning. In most embodiments, with respect to coarse tuning function, an MI may need half of the power that an MZI requires for the same tuning. In a particular embodiment, an MI has enabled>55 dB SMSR,>100 GHz (80 nm) tuning range without discontinuity points.

Generally, an MI may use a beam splitter to split a light source, such as a laser, into two different paths or arms (of the MI). Usually, at the end of the arm or path there is a reflective surface, such as a mirror, that reflects light back towards a beam splitter. Typically, a beam splitter may combine the reflected light from each arm and combine the amplitude of each reflected light beam using a superposition principle. Conventionally, an interference pattern that is not directed back toward the source of the light is directed to a photoelectric detector or camera. In different embodiments, the two light paths of an interferometer may have different lengths or optical elements.

In certain embodiments, two Vernier rings may provide fine tuning control by aligning a resonant wavelength via thermo-optic phase shifters (TOPS). In some embodiments, an MI may provide coarse tuning, where the MI filter consists of two arms with two TOPSs. In many embodiments, an MI with two arms and two TOPSs may have the two TOPSs work in "push-pull" mode to provide both MI coarse filter functions and cavity phase control.

In certain embodiments, with a laser with an MI and two TOPSs, one in each arm of the MI, when phase changes from the TOPSs are the same, i.e., $\Delta\Phi1=\Delta\Phi2$, a cavity phase of the laser may be changed by $2*\Delta\Phi1$ (factor '2' is due to round trip), while the coarse filter MI phase change is 0. In certain embodiments, with a laser with an MI and two TOPSs, when phase changes from each TOPS are opposite, i.e., $\Delta\Phi1=-\Delta\Phi2$, a cavity phase change may be 0, while an MI phase change may be $4*\Delta\Phi1$. In many embodiments, a resonant wavelength of an MI filter in a laser system may be tuned to align with a wavelength of two rings of the laser system while holding the same cavity phase. In most embodiments, a FSR of an MI filter may be larger than a FSR of a Vernier ring and may suppress a potential competing mode away from a target lasing mode.

Figure 1A:
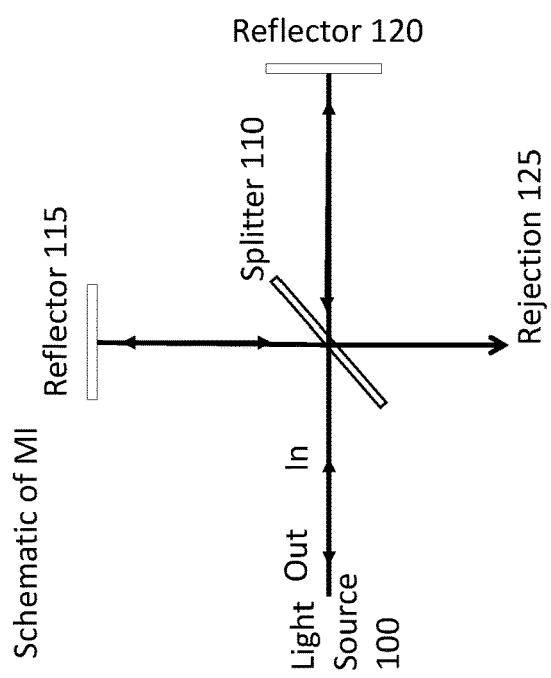
FIG. 1A is a simplified illustration of a schematic of a Michelson Interferometer, in accordance with an embodiment of the present disclosure.

Refer now to the example embodiment of FIG. 1A, which illustrates a simplified embodiment of light path of a Michelson Interferometer. Michelson Interferometer has light source 100 which provides light to splitter 110. Splitter 110 splits light from light source 100 to reflector 115 and reflector 120. Reflector 115 reflects light received from splitter 110 and Reflector 120 reflects light received from splitter 110. Splitter 110 combines light received from reflectors 115 and 120 and sends light to rejection 125.

Refer now to the example embodiment of FIG. 1B, which illustrates a graph of light transmission verses optical frequency for a Michelson Interferometer. In this example embodiment, the transmission peak of $T_{out}$ corresponds to most favored light frequency that sees lowest loss from MI filter. The transmission minimum of $T_{out}$ corresponds to most suppressed light frequency that sees highest loss from the MI filter. For this example embodiment, Terahertz(THz) is the unit for optical frequency, which may be a different way to describe optical wavelength: Optical frequency=light speed÷optical wavelength.

Figure 2:
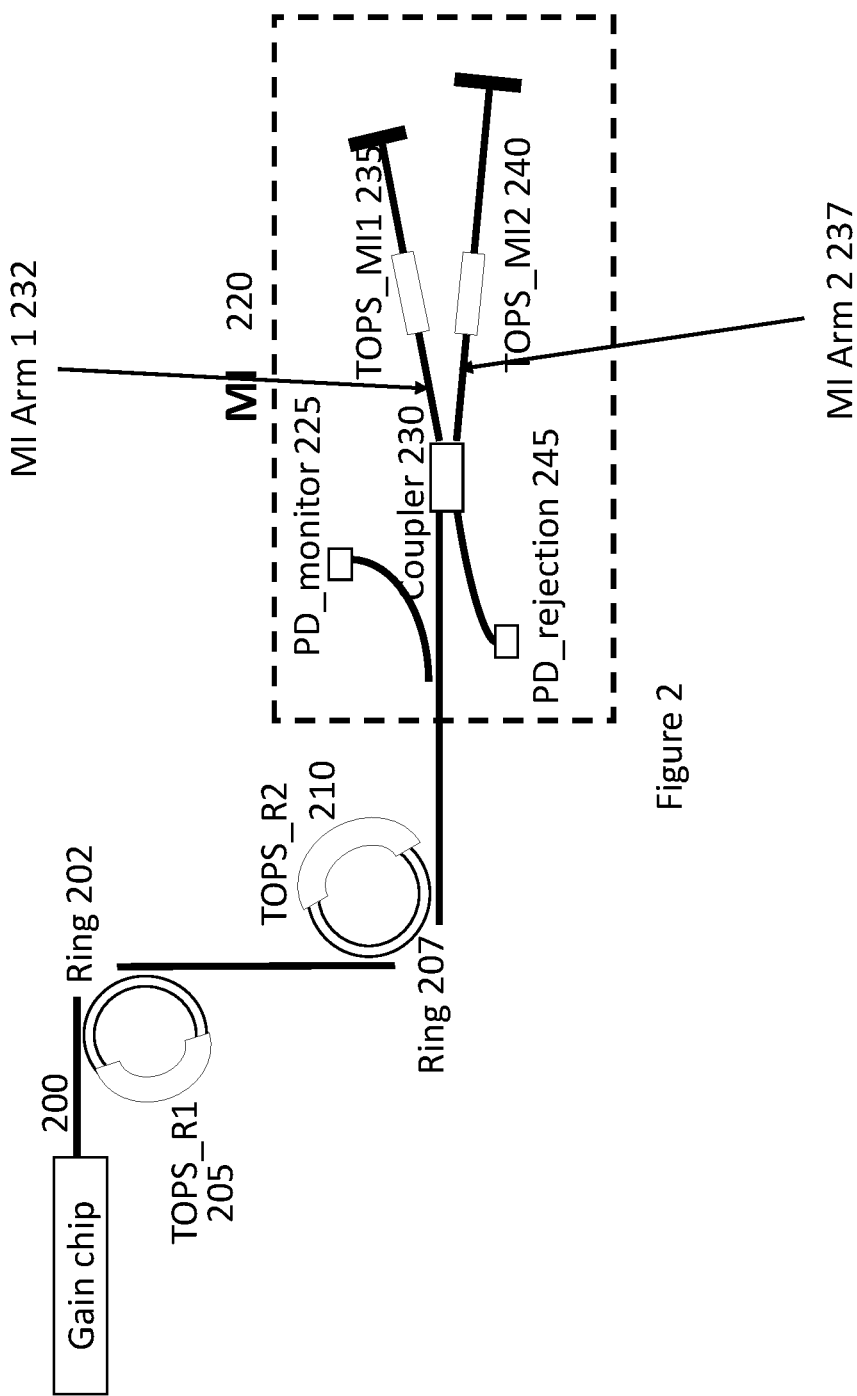
FIG. 2 is a simplified illustration of a laser system configuration with an external cavity with two ring resonators and a Michelson Interferometer, in accordance with an embodiment of the present disclosure.

Refer now to the example embodiment of FIG. 2, which illustrates a laser system configuration in an external cavity with a Michelson Interferometer. In the example embodiment of FIG. 2, gain chip 200 provides a light source to Ring 202. Ring 202 has TOPS_R1 205. TOPS_R 1 205 is enabled to heat Ring 202 to change the optical properties of Ring 202. Ring 202 is optically coupled to Ring 207. Ring 207 has TOPS_R2 210. TOPS_R2 210 is enabled to heat Ring 207 to change the optical properties of Ring 207. Ring 207 is optically coupled to Michelson Interferometer 220. MI 220 has PD_monitor 225, Coupler 230, TOPS_MI1 235, TOPS_MI2 240, and PD_rejection 245. PD_monitor 225 is a photodiode that monitors input light to MI 220. Coupler 230 splits light received from Ring 207 into MI Arm 1 232 and MI Arm 2 237. TOPS_MI1 235 is enabled to heat MI Arm 1 232 to change the optical properties of MI Arm 1 232. TOPS_MI1 240 is enabled to heat MI Arm 2 237 to change the optical properties of MI Arm 2 237. Coupler 230 combines light from MI Arm 1 232 and MI Arm 2 237 and sends light to PD_rejection 245.

In the example embodiment of FIG. 2, TOPS_R1 205 and TOPS_R2 210 are used to tune the resonant wavelengths of two rings (fine filters) Ring 202 and Ring 207, respectively. TOPS_MI1 235 and TOPS_MI2 240 are used to tune both MI coarse filter 220 and the cavity phase. Vernier rings 202 and 207 provide fine tuning control by aligning a resonant wavelength via thermo-optic phase shifters (TOPS) TOPS_R1 205 and TOPS_R2 210. MI coarse tuning filter 220 has two arms, arm MI1 232 and arm MI2 237, and each arm has a TOPS, TOPS_MI1 235 and TOPS_MI2 240, respectively. TOPSs 235 and 240 work in "push-pull" mode to provide both coarse filter functions and cavity phase control.

In the example embodiment of FIG. 2, when phase changes from TOPS_MI1 235 and TOPS_MI2 240 are the same, i.e., $\Delta\Phi1=\Delta\Phi2$, the cavity phase is changed by $2*\Delta\Phi1$ (factor '2' is due to round trip), while the coarse filter MI's 220 phase change is 0. As well, when phase changes from TOPS_MI1 235 and TOPS_MI2 240 are opposite, i.e., $\Delta\Phi1=-\Delta\Phi2$, cavity phase change is 0, while the course filter MI's 220 phase change is $4*\Delta\Phi1$ and the resonant wavelength of MI filter 220 is tuned to align with two rings, Ring 202 and Ring 207, while holding the same cavity phase. In this embodiment, the corresponding MI filter 220 TOPS power, for TOPS_MI1 235 and TOPS_MI2 240 is P_MI=P_MI1-P_MI2. In FIG. 2, FSR of MI filter 220 is larger, twice that, of Vernier ring FSR, Ring 202 and Ring 207, which enables it to suppress potential competing mode which is FSR12 away from the target lasing mode.

Figure 3:
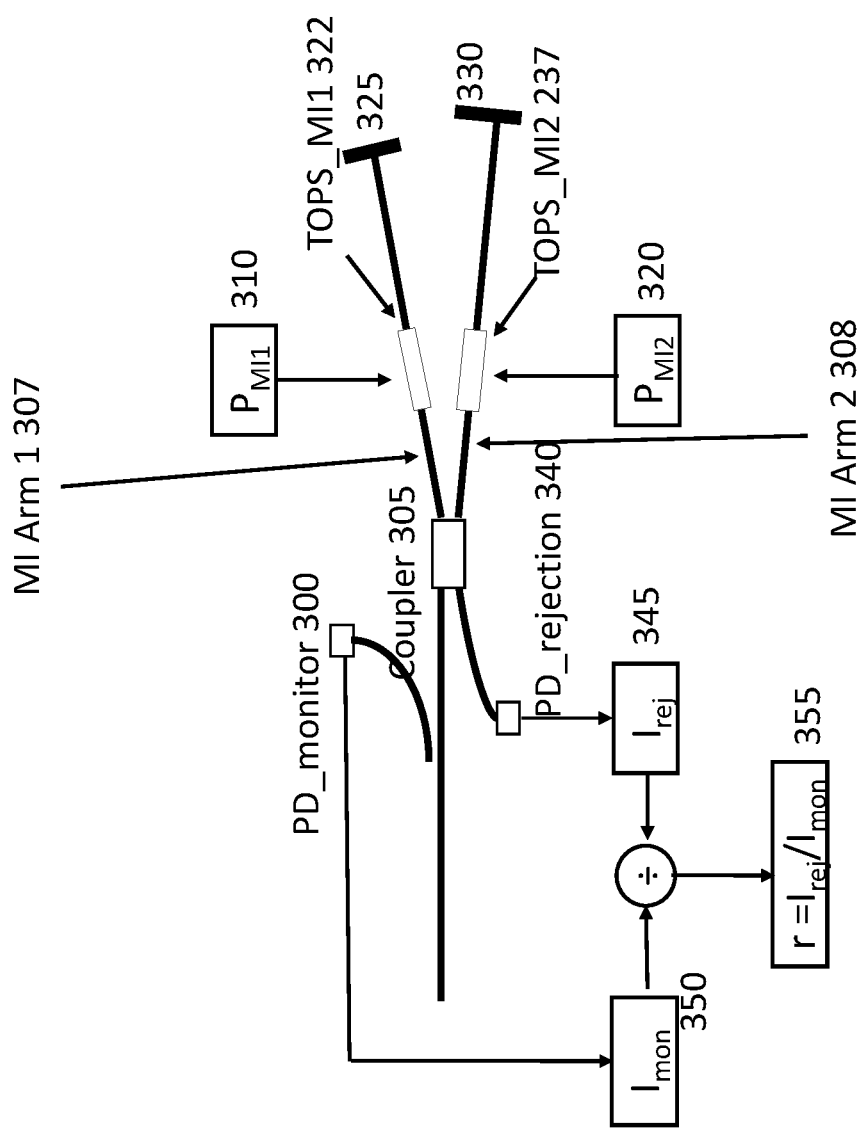
FIG. 3 is a simplified illustration of a Michelson Interferometer and measuring of a ratio of rejected light (light not coupled back to the input path) to output light, in accordance with an embodiment of the present disclosure.

Refer now to the example embodiment of FIG. 3, which illustrates measuring of a ratio of rejected output light (which is not coupled back to the input path) to input light. In FIG. 3, input photodiode monitor 300 provides an input signal to $I_{mon}$ 350 that represents the input light signal. Coupler 305 splits light to MI arm 1 307 and MI Arm 2 308. Power in TOPS_MI1 322 is equal to $P_{MI1}$ 310 and power in TOPS_MI 337 is equal to PMI2 320. Light in each MI arm, MI arm 1 307 and MI Arm 2 308, is reflected off reflectors 325 and 330, respectively, to coupler 305. Rejection light is measured by rejection photodetector PD_rejection 340 and used as an input to $I_{rej}$ 345. The ratio of $I_{rej}$ to $I_{mon}$ is represented as 355.

Figure 4:
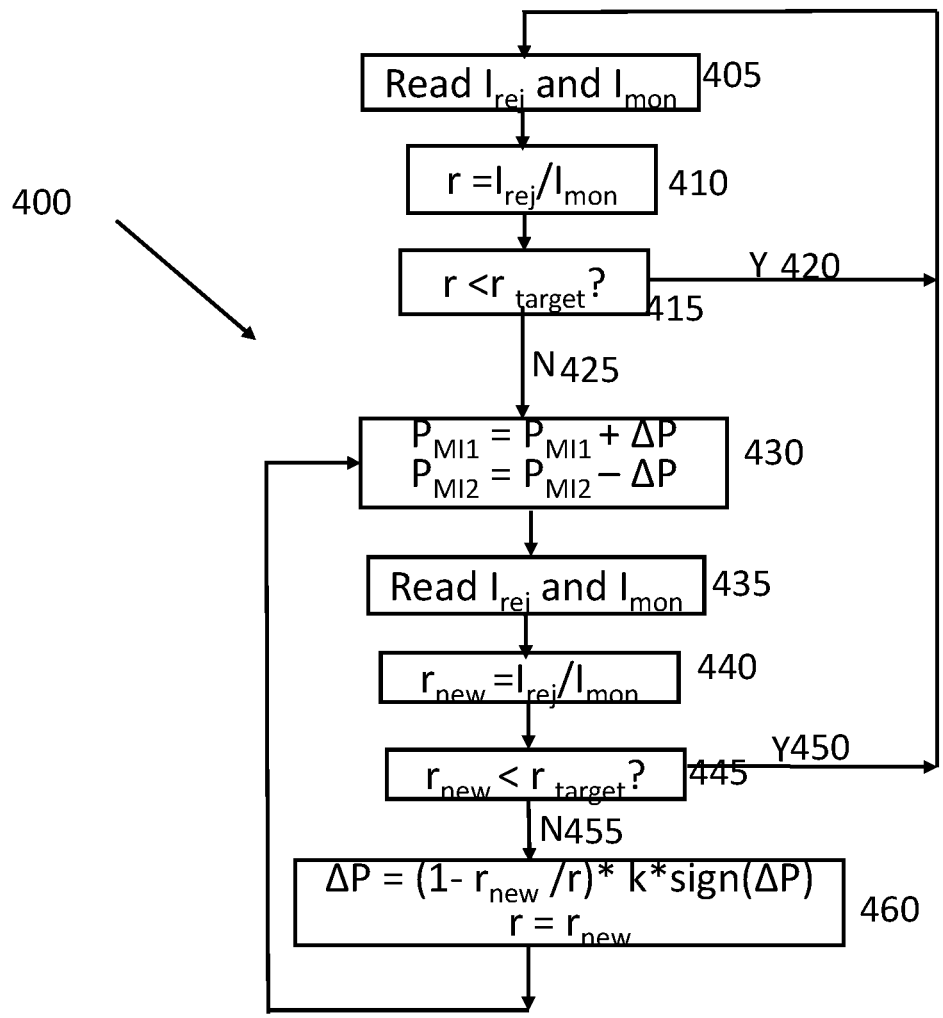
FIG. 4 is a simplified illustration of a method for a control loop for a Michelson Interferometer, in accordance with an embodiment of the present disclosure.

Refer now as well to the example embodiment of FIG. 4, which illustrates a control loop 400 for a MI course filter. The values for $I_{rej}$ and $I_{mon}$ are read (step 405). The ratio of the readings from the photodiodes is determined as r (step 410). A determination is made if ratio r is less than $r_{target}$ (Step 415). If yes, then the loop returns to step 405 (step 420). In other embodiments, a determination may be optional and calculations for $I_{rej}$ and $I_{mon}$, the ratio of $I_{rej}$ and $I_{mon}$, and a determination of whether a ratio r is less than $r_{target}$ may operate continuously.

Referring back to the example embodiment of FIGS. 3 and 4, if no, then control loop proceeds to step 430 (step 425). In step 430, a new amount of power is set for the TOPS by adding a value $\Delta P$ to $P_{MI1}$ and subtracting the predefined value, $\Delta P$ to $P_{MI2}$ (step 430). The value for $I_{rej}$ and $I_{mon}$ are read (step 435). A new Ratio, $r_{new}$, is calculated by comparing $I_{rej}$ and $I_{mon}$ (step 440). A determination is made if ratio $r_{new}$ is less than $r_{target}$ (step 445). If yes, then the loop returns to step 405 (step 450). If no, then control loop moves to step 460 (step 455). $\Delta P$ is set to be $((1-r_{new}/r)*k*sign(\Delta P))$ and r is set to be $r_{new}$ and control loop returns to step 430 (step 460). In some embodiments, $\Delta P$ may initially be set to be .1 mW. In these embodiments, a hill-climbing type algorithm is used for the control loop. In other embodiments, dither and demodulation may be used to hold $I_{rej}$ at a minimum value.

In many embodiments, one or more of the current techniques may be performed in a digital signal processor (DSP). In most embodiments, one or more of the current techniques may be performed in real time. In further embodiments, a control loop may be implemented in digital logic. In other embodiments, a control loop may be implemented in analog logic. In some embodiments, a control loop may be embodied in a digital circuit. In other embodiments a control loop may be embodied in a digital circuit.

In some embodiments, one or more of the embodiments described herein may be stored on a computer readable medium. In certain embodiments, a computer readable medium may be one or more memories, one or more hard drives, one or more flash drives, one or more compact disk drives, or any other type of computer readable medium. In certain embodiments, one or more of the embodiments described herein may be embodied in a computer program product that may enable a processor to execute the embodiments. In many embodiments, one or more of the embodiments described herein may be executed on at least a portion of a processor. In most embodiments, a processor may be a physical or virtual processor. In other embodiments, a virtual processor may be spread across one or more portions of one or more physical processors.

What is claimed is:

1. An external laser cavity comprising:
a first ring;
a second ring, wherein the first ring is a waveguide optically coupled to the second ring; and
a Michelson Interferometer filter (MI filter) comprising different path lengths,
wherein the second ring is optically coupled to the Michelson Interferometer filter,
wherein the MI filter is a coarse tuning filter with a free spectrum range (FSR) greater than 6 THz,
wherein the MI filter is used to enhance a side mode suppression of the first ring and the second ring, and
wherein the FSR of the MI filter is greater than twice a compound FSR of the first ring and the second ring.

2. The external laser cavity of claim 1, wherein a first thermo-optic phase shifter (TOPS) is attached to a first arm of the MI filter.

3. The external laser cavity of claim 2, wherein the first TOPS is driven together with a second TOPS to change the cavity phase, and in opposition to change the MI wavelength, and
wherein the second TOPS is attached to a second arm of the MI filter.

4. The external laser cavity of claim 1, wherein the free spectrum range of a reflectivity of the MI filter is between 0.2 and 2.0 times a 3-dB bandwidth of an optical gain in the laser.

5. The external laser cavity of claim 1, wherein the MI filter has a coupler, a first MI filter arm, a second MI filter arm, and a rejection photodetector,
wherein the first MI filter arm has a first thermo-optic phase shifter (TOPS) heater, and
wherein the second MI filter arm has a second TOPS heater.

6. The external laser cavity of claim 5, further comprising control logic comprising logic to minimize a photocurrent from the rejection photodetector.

7. The external laser cavity of claim 6, further comprising a photodetector monitor,
wherein the control logic is configured to minimize the photocurrent from the rejection photodetector by determining a ratio between the photocurrent from the rejection photodetector and a photocurrent from the photodetector monitor.

8. The external laser cavity of claim 7, wherein the control logic further comprises logic to compare the ratio to a target ratio.

9. The external laser cavity of claim 8, wherein the control logic further comprises logic to adjust a power level applied to the first TOPS heater of the first MI filter arm and a power level applied to the second TOPS heater of the second MI filter arm.

10. The external laser cavity of claim 1, wherein the first ring and the second ring are ring resonators.

11. The external laser cavity of claim 1, wherein the MI filter is further configured to enable a cavity phase tuning.

12. The external laser cavity of claim 1, wherein the free spectrum range of the MI filter is greater than a free spectrum range of each of the first ring and of the second ring.

13. The external cavity laser of claim 1, wherein the first ring and the second ring are configured to enable a high-finesse laser filtering control.

14. A method for tuning an external laser cavity, wherein the laser has a Michelson Interferometer filter (MI filter), a first ring, and a second ring, wherein the MI filter has a first thermo-optic phase shifter (TOPS) on a first arm of the MI filter and a rejection photodetector, wherein the MI filter has a free spectral spectrum range (FSR) greater than 6 THz, wherein the FSR of the MI filter is greater than twice a compound FSR of the first ring and the second ring, the method comprising:
minimizing a photocurrent current from the rejection photodetector, wherein the MI filter is coarse tuning filter; and
enhancing a side mode suppression of the first ring and the second ring using the MI filter.

15. The method of claim 14, wherein minimizing the photocurrent current from the rejection photodetector comprises determining a ratio between the photocurrent current from the rejection photodetector and a photocurrent from a photodetector monitor.

16. The method of claim 15 wherein the method further includes comparing the ratio to a target ratio.

17. The method of claim 14, the method further comprising:
   adjusting a power level of the first TOPS heater of the first MI filter arm and a power level of a second TOPS heater of a second MI filter arm.

18. The method of claim 17 wherein adjusting the power level comprises changing the power level of the first TOPS heater on the first MI filter arm by adding a delta power factor, and changing the power level of the second TOPS heater on the second MI filter arm by subtracting the delta power factor.

19. The method of claim 14 wherein the first ring and the second ring are high-finesse tuning filters.

\* \* \* \* \*